(12) United States Patent
Li

(10) Patent No.: US 10,382,047 B1
(45) Date of Patent: Aug. 13, 2019

(54) OPTIMUM PHASE SEARCHING SYSTEM AND METHOD THEREOF IN ETHERNET PHYSICAL LAYER

(71) Applicant: ALi Corporation, Hsinchu (TW)

(72) Inventor: Rong-yun Li, Shanghai (CN)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 15/995,860

(22) Filed: Jun. 1, 2018

(51) Int. Cl.
  *H03L 7/107* (2006.01)
  *H04L 12/12* (2006.01)
  *H04L 25/03* (2006.01)

(52) U.S. Cl.
  CPC .......... *H03L 7/1075* (2013.01); *H04L 12/12* (2013.01); *H04L 2025/0349* (2013.01)

(58) Field of Classification Search
  CPC ................ H03L 7/1075; H04L 12/12; H04L 2025/0349
  See application file for complete search history.

(56) References Cited

U.S. PATENT DOCUMENTS

| | | | |
|---|---|---|---|
| 7,154,946 B1 * | 12/2006 | Katic | H04L 7/0058 375/233 |
| 7,301,997 B1 * | 11/2007 | Wang | H04B 10/6971 333/18 |
| 9,215,107 B1 * | 12/2015 | De Bernardinis | H04L 25/03057 |
| 2006/0083296 A1 * | 4/2006 | Bhattacharjee | H04L 25/03057 375/232 |

* cited by examiner

*Primary Examiner* — Jaison Joseph
(74) *Attorney, Agent, or Firm* — Li & Cai Intellectual Property (USA) Office

(57) ABSTRACT

A system for optimum phase searching in an Ethernet physical layer includes a time recovering circuit and an equalizer. The time recovering circuit includes a loop filter and a time error detector, and the equalizer includes a feed forward equalizer, a slicer and a feed backward equalizer. An optimum phase searching method includes obtaining optimum phases when mean squared errors calculated by the slicer are less than a first threshold, absolute values of mean values of outputs calculated by a time error detector are less than a second threshold, and the outputs are monotonic.

11 Claims, 6 Drawing Sheets

OPTIMUM PHASE SEARCHING SYSTEM AND METHOD THEREOF IN ETHERNET PHYSICAL LAYER

FIELD OF THE DISCLOSURE

The present disclosure relates to phase searching in an Ethernet physical layer, and in particular, to a method and a system to search optimum phases in an Ethernet physical layer.

BACKGROUND OF THE DISCLOSURE

Referring to FIG. 1, when performing a conventional optimum phase searching, a voltage-controlled oscillator (VCO) 1, a time recovery circuit (TR) 2, an equalizer (EQ) 3 and an analog to digital converter (ADC) 4 are essential modules in a phase searching and prediction system.

Referring to FIG. 2, which is a relationship diagram between phases and mean squared errors (MSE) showing a result obtained from a conventional optimum phase searching method, and MSE is in a jitter state.

Therefore, the conventional optimum phase searching method is to search all possible phases according to the MSE values calculated by a slicer of an equalizer. In order to prevent the time recovery circuit and equalizer from interfering with each other, it is common to disable the time recovery circuit temporarily and having the equalizer work alone. However, when clock signals jitter, several phases might be obtained including unwanted ones, which can cause misjudgment regarding which one is the optimum phase, as seen in FIG. 2.

In addition, open loop and S-curve analysis of the time recovery circuit are also commonly used in a phase searching system. The advantage of open loop is its simpler layout and hence is more economical and stable due to simplicity and easier construction.

When performing the conventional phase searching, accuracy and reliability are concerned since conventional optimum phase searching systems do not have a feedback mechanism. Therefore, the conventional optimum phase searching methods are inaccurate in terms of resulting output and hence are unreliable too.

Therefore, there is a need to provide an accurate and reliable method to find an optimum phase in Ethernet physical layer.

SUMMARY OF THE DISCLOSURE

An aspect of the present disclosure provides an optimum phase searching system and method thereof in an Ethernet physical layer for effectively searching optimum phases in an Ethernet physical layer.

An aspect of the present disclosure provides a method and system for optimum phase searching in an Ethernet physical layer. The optimum phase searching system includes a time recovering circuit and an equalizer. The time recovering circuit further includes a loop filter and a time error detector, and the equalizer further includes a feed forward equalizer, a slicer and a feed backward equalizer. The optimum phase searching method obtains optimum phases when MSE values calculated by the slicer are less than a first threshold, absolute values of mean values of outputs calculated by a time error detector are less than a second threshold, and the outputs are monotonic, and the monotonicity represents a relationship between the mean values of the outputs of the time error detector of a current phase and that of at least one previous phase.

The advantage of the present disclosure is, when the optimum phase searching ends, both the time recovery circuit and the equalizer converge to a stable state. The coefficient of the equalizer is applied on time recovery circuit analysis, and the MSE value(s) of the slicer is being analyzed to determine the optimum phases.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The present disclosure will become more fully understood from the detailed description and the accompanying drawings, in which.

Wherever possible, the same reference numbers are used in the drawings and the description to refer to the same or like parts.

Figure 1:
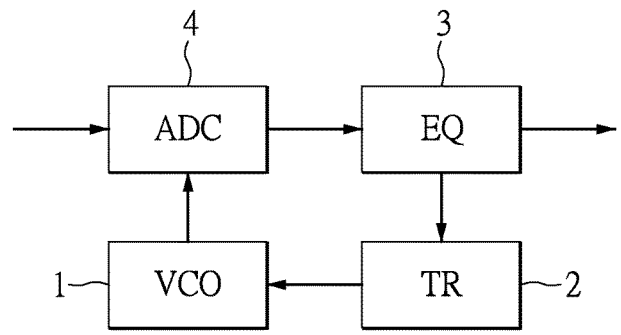
FIG. 1 is a block diagram of a conventional phase searching.
Figure 2:
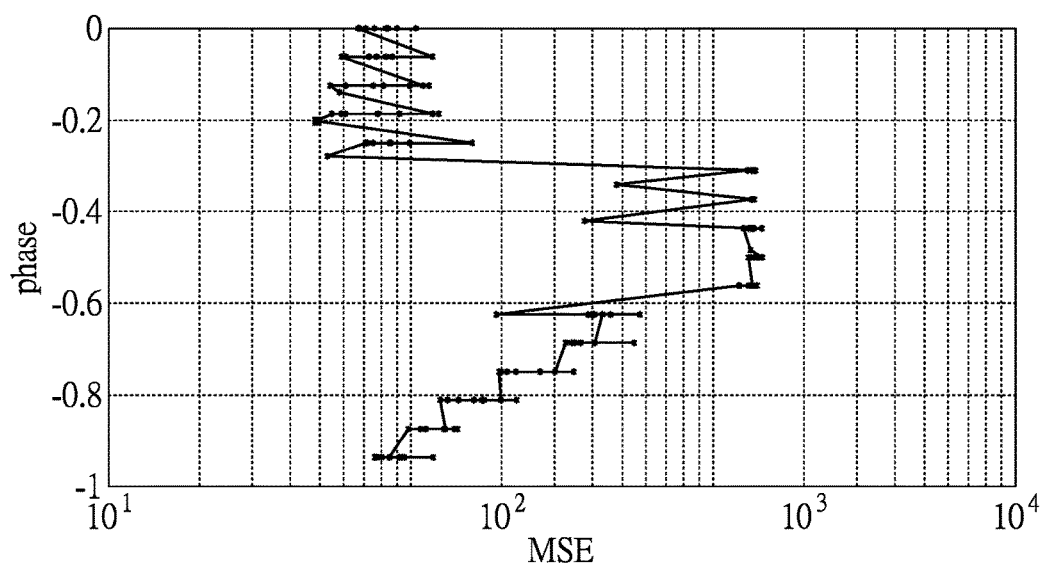
FIG. 2 is a relationship diagram between phase and MSE of a conventional phase searching method.

It is noted that the term "first" and "second" for describing different elements or signals are only used to distinguish these elements/signals from one another rather than limiting the nature thereof. In addition, the term "or" used in the specification may include one or more of the listed items.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, and no special significance is to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

While numbering terms such as "first", "second" or "third" may be used in this disclosure to describe various components, signals or the like, the terms are for distinguishing one component from another component, or one signal from another signal only, and are not intended to, nor should they be construed to impose any other substantive descriptive limitations on the components, signals or the like.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

Figure 3:
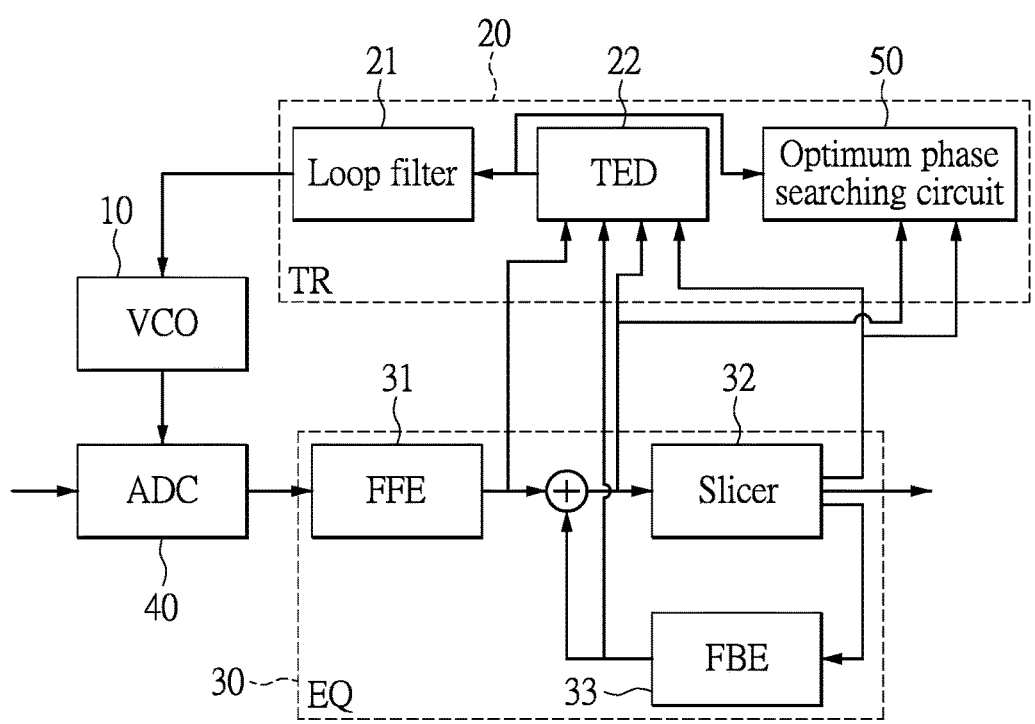
FIG. 3 is a block diagram of optimum phase searching of the present disclosure.

Referring to FIG. 3, an optimum phase searching system for an Ethernet physical layer according to an embodiment of the present disclosure includes a voltage-controlled oscillator (VCO) 10, a time recovery (TR) circuit 20, an equalizer (EQ) 30 and an analog to digital converter (ADC) 40. The time recovery circuit 20 further includes a loop filter 21, a time error detector (TED) 22 and an optimum phase searching circuit 50. The equalizer 30 further includes a feed forward equalizer (FFE) 31, a slicer 32 and a feed backward equalizer (FBE) 33. In actual practice, the optimum phase searching circuit 50 is configured to be internal of the time recovery circuit 20. However, it should be understood that the optimum phase searching circuit 50 can also be configured to be independent from the time recovery circuit 20. In certain embodiments, each of the time recovery circuit 20, the equalizer 30 and the optimum phase searching circuit 50 is separated and independent from one another. The voltage-controlled oscillator 10 receives an input from the time error detector 22 through the loop filter 21 of the time recovery circuit 20, and outputs a digital signal to the feed forward equalizer 31 of the equalizer 30 via the analog to digital converter 40. The slicer 32 of the equalizer 30 is connected electrically to the feed forward equalizer 31, the feed backward equalizer 33, the time error detector 22 and the optimum phase searching circuit 50, and is configured to slice and obtain MSE value(s) of the equalizer 30 and mean value(s) of deviation values of the time error detector 22. Specifically, by the slicing operation of the slicer 32, the MSE value(s) of the equalizer 30 can be obtained based on inputs and outputs of the slicer 32, i.e., difference between the slicer output and the slicer input. In addition, output(s) of the feed forward equalizer 31, inputs and outputs of the slicer 32 are transmitted to the time error detector 22 for obtaining the deviation values of the time error detector 22, such that the time error detector 22 calculates the statistic correlation of the coefficients of the equalizer 30 (EQ coefficients) between a current time period and previous time period(s) based on the output(s) of the feed forward equalizer 31, and inputs and outputs of the slicer 32. The optimum phase searching circuit 50 receives signals from output of the time error detector 22 (TED output), and inputs and outputs of the slicer 32. The present disclosure provides a close loop approach as shown in FIG. 3. In certain embodiments, the time error detector 22 and the slicer 32 are directly connected to the optimum phase searching circuit 50. In certain embodiments, the output(s) of the feed backward equalizer 33 could be transmitted to the time error detector 22 based on choice of TED Algorithm, such as Mueller and Muller, ZeroForcing, etc. FIG. 3 shows merely one of the embodiments, and the present disclosure should not be limited thereto.

Figure 4:
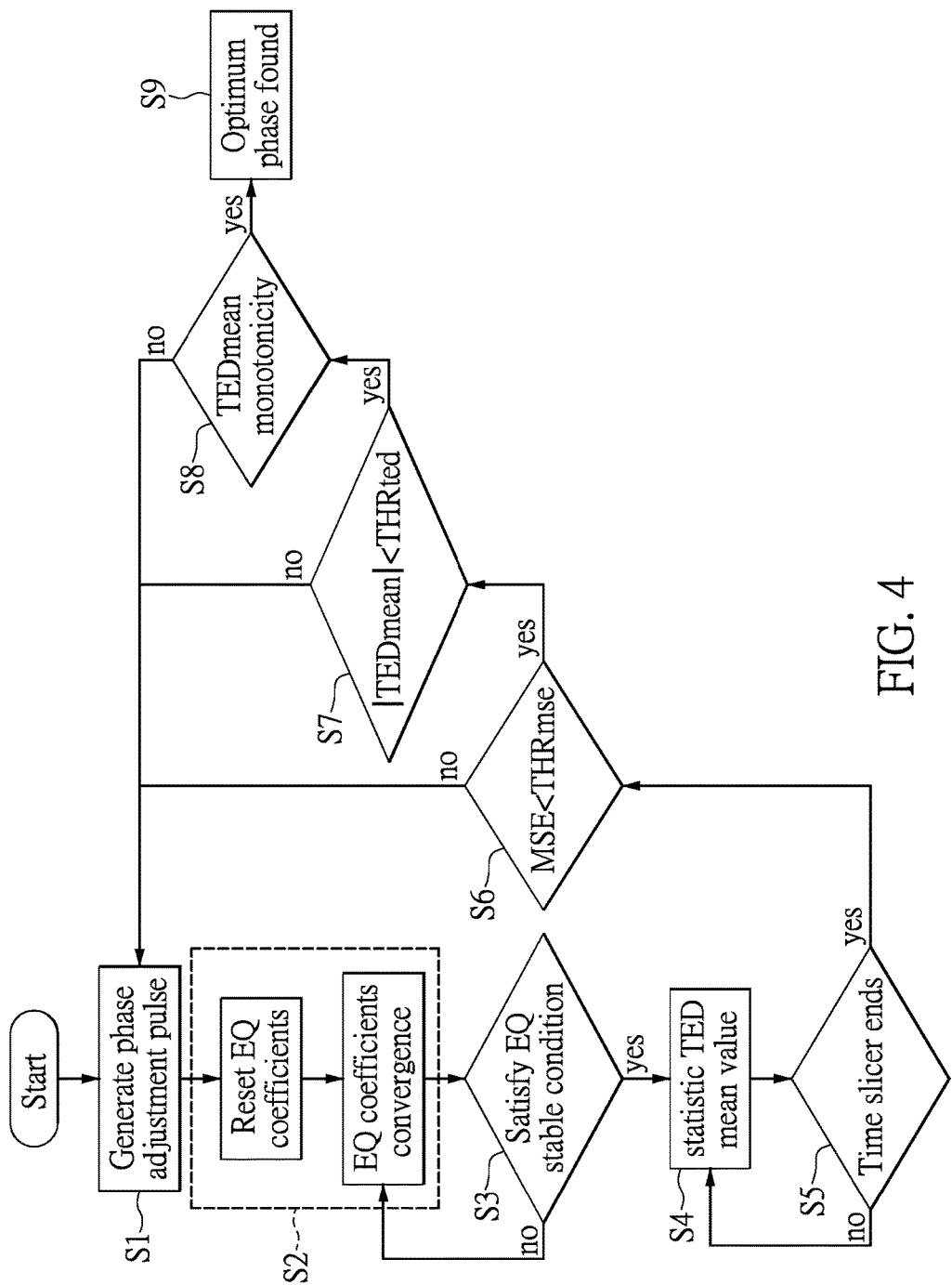
FIG. 4 is a flowchart of an optimum phase searching method of the present disclosure.

Referring to FIG. 4, which is a flowchart of an optimum phase searching method according to one embodiment of the present disclosure. At first, a phase adjustment pulse is generated by a receiver for a predetermined period of time (shown as S1). In response to the phase adjustment pulse being generated (S1), the slicer 32 (shown in FIG. 3) slices to reset coefficients of the equalizer 30 based on a predetermined starting value, which can be based on a degree of channel interference, e.g., a length of a cable (shown as S2).

Further, in response to the resetting of the equalizer coefficient(s) (S2), the equalizer coefficient(s) converges, and then the MSE values of the equalizer 30 decline. The MSE values of the equalizer 30 can continue to decline till a predetermined equalizer stable condition is satisfied (shown as S3), that is, the MSE values of the equalizer 30 do not jitter, defining that the predetermined equalizer stable condition is satisfied. In response to determining that the predetermined EQ stable condition is satisfied (S3), the equalizer 30 sends the MSE value(s) during a period of time when the MSE values of the equalizer 30 satisfy the above-mentioned EQ stable condition to the optimum phase searching circuit 50. Meanwhile, the optimum phase searching circuit 50 receives the deviation values of the time error detector 22 (TED deviation values) from the TED outputs, performs statistical calculation for the TED deviation values during the EQ stable condition, and then calculates at least one mean value of the TED deviation values (shown as S4). In response to obtaining the mean value(s) of the TED deviation values (S4), time slicer ends (shown as S5).

Specifically, the time slicer in the present disclosure can be timeslices having fixed time periods.

After receiving the MSE value(s) from the equalizer 30, the optimum phase searching circuit 50 compares the MSE value(s) with a predetermined MSE threshold THRmse (the first criterion) to produce a first comparison result, and determines whether the MSE value(s) is less than the predetermined MSE threshold THRmse based on the first comparison result (shown as S6). In response to determining that the MSE value(s) is less than the predetermined MSE threshold THRmse (the first criterion is satisfied), the optimum phase searching circuit 50 proceeds to the next step. Otherwise, in response to determining that the MSE value(s) is greater than or equal to the MSE threshold THRmse (the first criterion is not satisfied), the optimum phase searching circuit 50 sends a pulse-generating signal to the receiver, so that a phase adjustment pulse is generated by the receiver for a predetermined period of time (S1). In response to determining that the MSE value(s) is less than the THRmse (the first criterion is satisfied), the optimum phase searching circuit 50 compares the absolute value(s) of the mean value(s) of the TED deviation values with a predetermined time error detector threshold THRted (the second criterion) to produce a second comparison result, and determines whether the absolute value(s) of the mean value(s) of the TED deviation values is less than the predetermined time error detector threshold THRted based on the second comparison result (shown as S7). In response to determining that the absolute value(s) of the mean value(s) of the TED deviation values is less than the predetermined time error detector threshold THRted (the second criterion is satisfied), the optimum phase searching circuit 50 proceeds to the next step. Otherwise, in response to determining that the absolute value(s) of the mean value(s) of the TED deviation values is greater than or equal to the time error detector threshold THRted (the second criterion is not satisfied), the optimum phase searching circuit 50 sends a pulse-generating signal to the receiver, so that a phase adjustment pulse is generated by the receiver for a predetermined period of time (S1).

In response to determining that the absolute value(s) of the mean value(s) of the TED deviation values is less than the predetermined TED threshold THRted (the second criterion is satisfied), the optimum phase searching circuit 50 determines whether the trend of mean values of the TED deviation values is monotonic (the third criterion, shown as S8). In response to determining that the mean values of the TED deviation values is monotonic (the third criterion is satisfied), the optimum phase searching circuit 50 determines that an optimum phase is found (shown as S9), and the optimum phase searching operation of the optimum phase searching circuit 50 ends. Otherwise, in response to determining that either the trend of the mean values of the TED deviation values is not monotonic (the third criterion is not satisfied), the optimum phase searching circuit 50 sends a pulse-generating signal to the receiver so that a phase adjustment pulse is generated by the receiver for a predetermined period of time (S1). It is understood that the monotonicity in the present disclosure represents a relationship between mean values of the TED deviation values of a current phase and that of at least one previous phase. Specifically, a phase is adjusted when each of the time slices ends, and therefore, the mean values of the TED deviation values of previous phases are the statistical mean values of the TED deviation values when the previous time slices end.

In other words, in response to determining that MSE values of the equalizer 30 are less than a first threshold, at least one absolute value of at least one mean value of TED deviation values is less than a second threshold, and the trend of mean values of TED deviation values is monotonic, that is, all of the first to third criteria are satisfied (S6-S8), the optimum phase searching circuit 50 determines that an optimum phase has been found (S9), and the optimum phase searching operation ends. If any of the first to third criteria is not satisfied, the procedure of the optimum phase searching starts all over again.

In certain embodiments, the MSE threshold THRmse is greater than 0 and less than $\frac{1}{4} \Delta$, and the $\Delta$ is a variance of the input(s) and output(s) of the slicer 32. It is noted that the value $\frac{1}{4}$ as mentioned above can be varied in other embodiments of the present disclosure based on a desired performance, and should not be limited thereto.

In certain embodiments, the time error detector threshold THRted is greater than 0, and less than or equal to $K*\Delta\varphi$, the K is a slope of a S-curve, the $\Delta\varphi$ is a phase interval, and the S-curve corresponds to and is plotted from the characteristic outputs of the time error detector 22.

Figure 5:
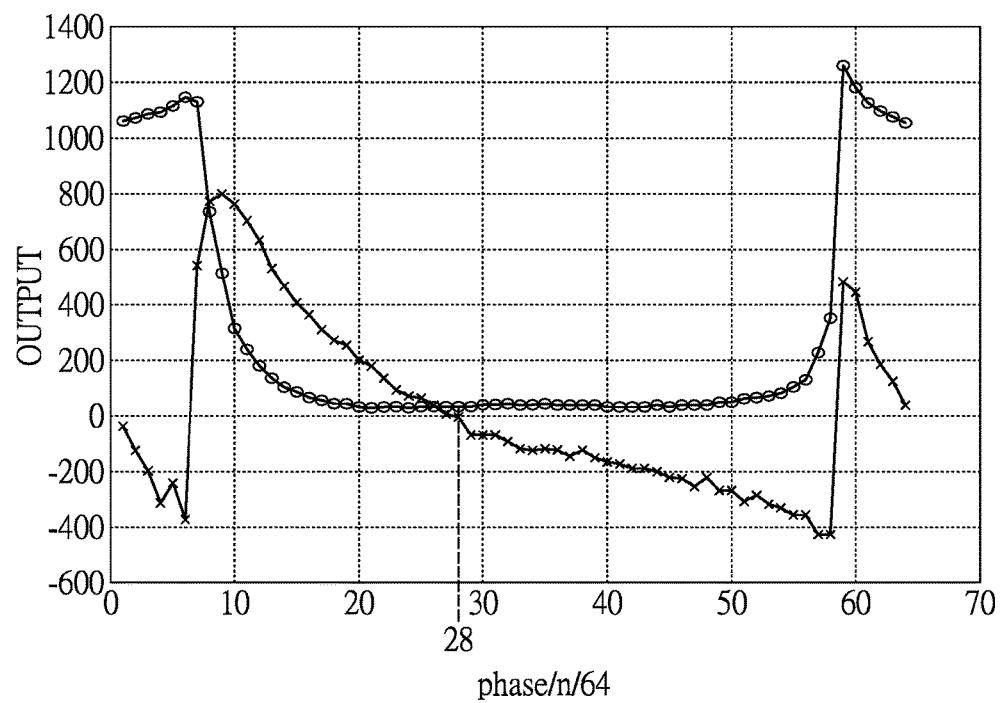
FIG. 5 is a relationship diagram between phase and the deviation values of an equalizer and a time error detector of the present disclosure.
Figure 6:
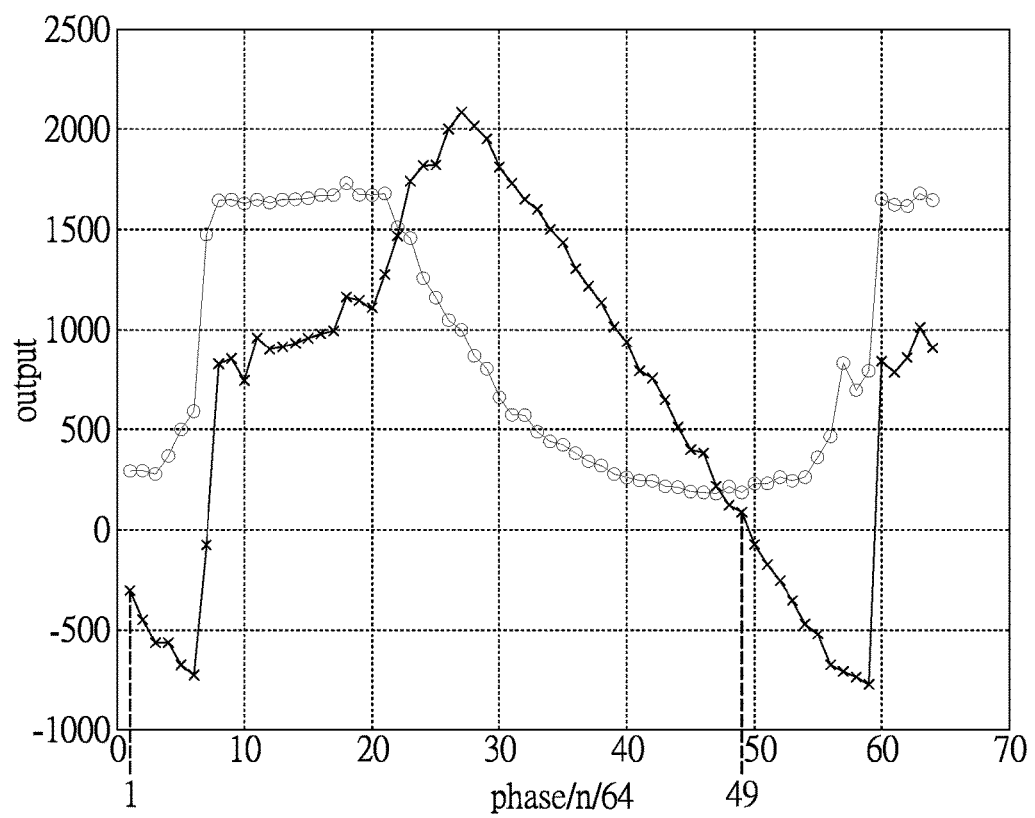
FIG. 6 is another relationship diagram between phase and the deviation values of the equalizer and the time error detector of the present disclosure.

Referring to FIG. 5, the horizontal axis therein represents the phase(s) of the time error detector 22 and the equalizer 30, which is divided equally into 64 portions, and the vertical axis therein represents the output of the time error detector 22 and the MSE values of the equalizer 30. Symbols "o" of the curve represent the MSE values of the equalizer 30, and symbols "x" of the curve represent the outputted deviation values of the time error detector 22. According to the disclosure mentioned above, the $28^{th}$ phase portion of the 64 phase portions "$28/64$" is the optimum phase since, at the $28^{th}$ phase portion, the MSE value(s) is less than the predetermined MSE threshold THRmse (the first criterion satisfied), the absolute value(s) of the mean value(s) of the TED deviation values is less than the predetermined TED threshold THRted (the second criterion satisfied), and the trend of mean values of TED deviation values is monotonic (the third criterion satisfied). According to the present disclosure, with satisfaction of all first to third criteria, the $28^{th}$ phase portion is found to be the optimum phase. Referring to FIG. 6, the horizontal axis therein represents the phase(s) of the time error detector 22 and the equalizer 30, and the vertical axis therein represents the output of the time error detector 22 and the MSE values of the equalizer 30. Symbols "o" of the curve represent the MSE values of the equalizer 30, and symbols "x" of the curve represent the outputted deviation values of the time error detector 22. Although the first phase portion of the 64 phase portions "$1/64$" satisfies both the first and the second criteria, where the MSE value(s) is less than the predetermined MSE threshold THRmse (the first criterion satisfied) and the absolute value(s) of the mean value(s) of the TED deviation values is less than the predetermined TED threshold THRted (the second criterion satisfied), it does not satisfy the third criterion (the $1^{st}$ phase portion is not in a monotonic section). Therefore, "$1/64$" is not the optimum phase. Instead, the $49^{th}$ phase portion of the 64 phase portions "$49/64$" is the optimum phase, since, at the $49^{th}$ phase portion, the MSE value(s) is less than the predetermined MSE threshold THRmse (the first criterion satisfied), the absolute value(s) of the mean value(s) of the TED deviation values is less than the predetermined TED threshold THRted (the second criterion satisfied), and the trend of mean values of TED deviation values is monotonic (the third criterion satisfied). According to the present disclosure, with satisfaction of all first to third criteria, the $49^{th}$ phase portion is found to be the optimum phase.

Figure 7:
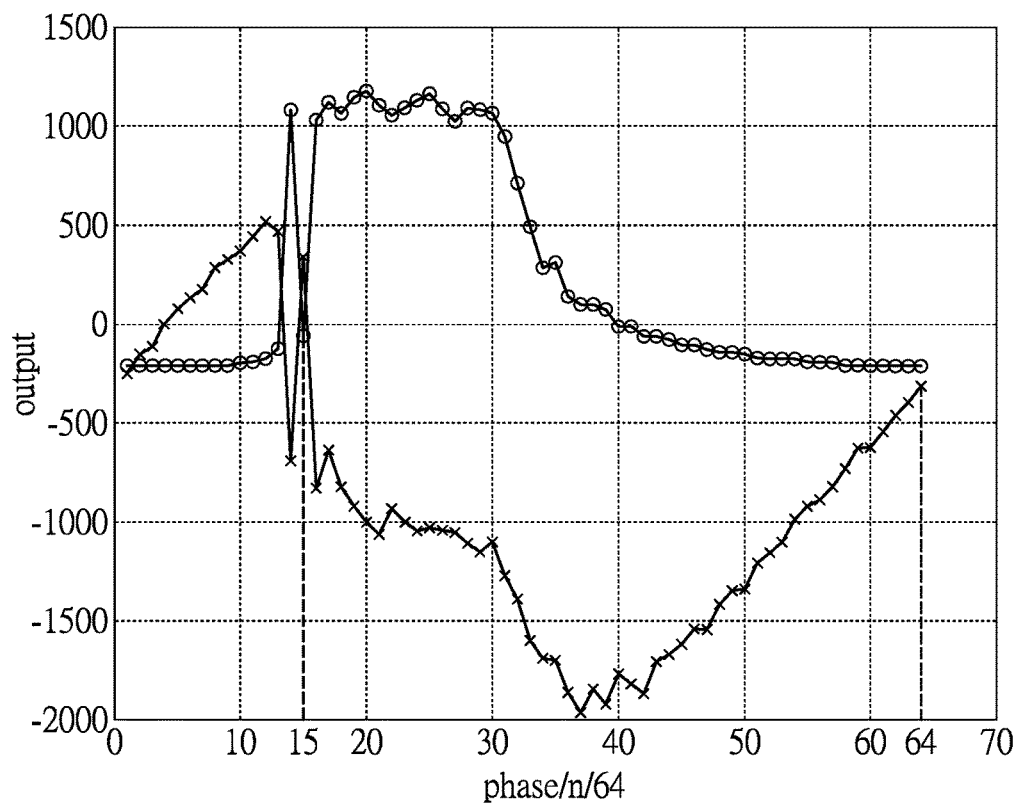
FIG. 7 is another relationship diagram between phase and the deviation values of the equalizer and the time error detector of the present disclosure.

Referring to FIG. 7, the horizontal axis therein represents the phase(s) of the time error detector 22 and the equalizer 30, and the vertical axis therein represents the output of the time error detector 22 and the MSE values of the equalizer 30. Symbols "o" of the curve represent the MSE values of the equalizer 30, and symbols "x" of the curve represent the outputted deviation values of the time error detector 22.

Even though the 15$^{th}$ phase portion of the 64 phase portions "15/64" satisfies both the first and second criteria, where the MSE value(s) is less than the predetermined MSE threshold THRmse (the first criterion satisfied) and the absolute value(s) of the mean value(s) of the TED deviation values is less than the predetermined TED threshold THRted (the second criterion satisfied) it does not satisfy the third criterion (the 15$^{th}$ phase portion is not in a monotonic section). As a result, "15/64" is not the optimum phase. Instead, the 64$^{th}$ phase portion of the 64 phase portions "64/64" is the optimum phase, since, at the 64$^{th}$ phase portion, the MSE value(s) is less than the predetermined MSE threshold THRmse (the first criterion satisfied), the absolute value(s) of the mean value(s) of the TED deviation values is less than the predetermined TED threshold THRted (the second criterion satisfied), and the trend of mean values of TED deviation values is monotonic (the third criterion satisfied). According to the present disclosure, with satisfaction of all first to third criteria, the 64$^{th}$ phase portion is found to be the optimum phase.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

Effectiveness of the Embodiments

One of the advantages of the present disclosure is that the time recovery circuit 20 and the equalizer 30 both converge to a stable state. The optimum phase searching circuit 50 of the present disclosure analyzes time recovery circuit 20 by using the information at the stable status of equalizer 30. In addition, the stable status can be further defined by width and height of an eye diagram.

Moreover, by using the properties of the time recovery circuit 20 for further restraining the result of the optimum phase searching, the optimum phase searching method of the present disclosure can be more precise than the conventional phase searching methods, which utilizes merely determination of the MSEs of the equalizer 30. The result of the optimum phase searching of the present disclosure is clear even when the MSEs of the equalizer 30 is in the jitter state.

Furthermore, the requirement of satisfying all three criteria of the optimum phase searching according to the present disclosure, as mentioned above, can provide a unique determination result of the optimum phase. As a result, the optimum phase searching method is effective and the cost and time of researching can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of searching an optimum phase from an Ethernet physical layer, comprising:
    resetting a coefficient of an equalizer based on a predetermined value, wherein the equalizer includes a slicer;
    determining whether the coefficient converges to a stable state; and
    obtaining at least one optimum phase when mean squared errors of inputs and outputs of the slicer calculated by the slicer are less than a first threshold, absolute values of mean values of outputs of a time error detector calculated by the time error detector are less than a second threshold, and the outputs are monotonic.

2. The method of claim 1, wherein the monotonicity represents a relationship between the mean values of the outputs of the time error detector of a current phase and that of at least one previous phase.

3. The method of claim 1, wherein the equalizer further includes a feed forward equalizer and a feedback equalizer.

4. The method of claim 1, wherein the first threshold is greater than 0 and less than ¼ Δ, and the Δ is a variance of inputs and outputs of the slicer.

5. The method of claim 4, wherein the second threshold is greater than 0 and less than K*Δφ, the K is a slope of a S-curve, and the Δφ is a phase interval.

6. The method of claim 5, wherein the S-curve is characteristic outputs of the time error detector.

7. An optimum phase searching system for an Ethernet physical layer, comprising:
    a timing recovery circuit including a time error detector; and
    an optimum phase searching circuit configured to obtain optimum phases when mean squared errors calculated by a slicer of an equalizer are less than a first threshold, absolute values of mean values of outputs calculated by the time error detector are less than a second threshold, the outputs are monotonic.

8. The optimum phase searching system of claim 7, wherein the monotonicity represents a relationship between the mean values of the outputs of the time error detector of a current phase and that of at least one previous phase.

9. The optimum phase searching system of claim 7, wherein the first threshold is greater than 0 and less than ¼ Δ, and the Δ is a variance of an input and an output of the slicer.

10. The optimum phase searching system of claim 9, wherein the second threshold is greater than 0 and less than K*Δφ, the K is a slope of a S-curve, and the Δφ is phase interval.

11. The method of claim 10, wherein the S-curve is characteristic outputs of the time error detector.

* * * * *